United States Patent
Ko et al.

(10) Patent No.: US 8,906,740 B2
(45) Date of Patent: *Dec. 9, 2014

(54) INTEGRATED CIRCUIT PACKAGING SYSTEM HAVING DUAL SIDED CONNECTION AND METHOD OF MANUFACTURE THEREOF

(75) Inventors: Chan Hoon Ko, Incheon (KR); Soo-San Park, Seoul (KR); YoungChul Kim, Youngin-si (KR)

(73) Assignee: STATS ChipPAC Ltd., Singapore (SG)

( * ) Notice: Subject to any disclaimer, the term of this patent is extended or adjusted under 35 U.S.C. 154(b) by 420 days.

This patent is subject to a terminal disclaimer.

(21) Appl. No.: 13/085,475

(22) Filed: Apr. 12, 2011

(65) Prior Publication Data
US 2011/0186994 A1    Aug. 4, 2011

Related U.S. Application Data

(63) Continuation of application No. 12/413,302, filed on Mar. 27, 2009, now Pat. No. 7,923,290.

(51) Int. Cl.
| | |
|---|---|
| *H01L 21/44* | (2006.01) |
| *H01L 21/48* | (2006.01) |
| *H01L 21/50* | (2006.01) |
| *H01L 25/10* | (2006.01) |
| *H01L 25/00* | (2006.01) |
| *H01L 23/48* | (2006.01) |
| *H01L 23/498* | (2006.01) |
| *H01L 23/00* | (2006.01) |

(52) U.S. Cl.
CPC . *H01L 23/49833* (2013.01); *H01L 2224/16227* (2013.01); *H01L 2225/1041* (2013.01); *H01L 2224/16225* (2013.01); *H01L 2225/1023* (2013.01); *H01L 25/105* (2013.01); *H01L 23/49822* (2013.01); *H01L 25/50* (2013.01); *H01L 2224/48227* (2013.01); *H01L 24/48* (2013.01); *H01L 2224/32225* (2013.01); *H01L 23/481* (2013.01); *H01L 2225/1058* (2013.01); *H01L 2224/17181* (2013.01); *H01L 24/16* (2013.01); *H01L 24/17* (2013.01); *H01L 2224/73265* (2013.01); *H01L 2924/15311* (2013.01)

USPC ............ 438/106; 438/15; 438/124; 438/126; 438/127; 257/678; 257/777; 257/778; 257/787; 257/795; 257/E21.502; 257/E21.503; 257/E21.505; 257/E21.508

(58) Field of Classification Search
USPC ............ 438/15, 25–26, 51, 55, 64, 106–108, 438/124; 257/678, 777–782, 787, 795, 257/E21.499, E21.502, E21.503, E21.505, 257/E21.508
See application file for complete search history.

(56) References Cited

U.S. PATENT DOCUMENTS

| | | |
|---|---|---|
| 5,854,507 A | 12/1998 | Miremadi et al. |
| 5,973,396 A | 10/1999 | Farnworth |

(Continued)

*Primary Examiner* — Mohsen Ahmadi
(74) *Attorney, Agent, or Firm* — Ishimaru & Associates LLP

(57) ABSTRACT

A method of manufacture of an integrated circuit packaging system includes: mounting an integrated circuit, having a device through via and a device interconnect, over a substrate with the device through via traversing the integrated circuit and the device interconnect attached to the device through via; attaching a conductive support over the substrate with the conductive support adjacent to the integrated circuit; providing a pre-formed interposer, having an interposer through via and a pre-attached interconnect, with the pre-attached interconnect attached to the interposer through via; mounting the pre-formed interposer over the integrated circuit and the conductive support with the pre-attached interconnect over the device through via; and forming an encapsulation over the substrate covering the integrated circuit, the conductive support, and partially covering the pre-formed interposer.

20 Claims, 3 Drawing Sheets

(56) References Cited

U.S. PATENT DOCUMENTS

| | | |
|---|---|---|
| 6,084,308 A | 7/2000 | Kelkar et al. |
| 6,333,563 B1 | 12/2001 | Jackson et al. |
| 6,369,448 B1 | 4/2002 | McCormick |
| 6,717,251 B2 | 4/2004 | Matsuo et al. |
| 6,819,001 B2 | 11/2004 | Burdick, Jr. et al. |
| 6,828,665 B2 | 12/2004 | Pu et al. |
| 6,908,785 B2 | 6/2005 | Kim |
| 6,970,362 B1 | 11/2005 | Chakravorty |
| 7,122,906 B2 | 10/2006 | Doan |
| 7,279,795 B2 | 10/2007 | Periaman et al. |
| 7,317,256 B2 | 1/2008 | Williams et al. |
| 7,327,554 B2 | 2/2008 | Otsuka et al. |
| 7,598,617 B2 | 10/2009 | Lee et al. |
| 7,619,441 B1 | 11/2009 | Rahman et al. |
| 2004/0212094 A1 | 10/2004 | Farooq et al. |
| 2007/0246837 A1 | 10/2007 | Dong |
| 2009/0072375 A1 | 3/2009 | Song et al. |
| 2009/0134509 A1 | 5/2009 | Yim et al. |
| 2009/0236723 A1 | 9/2009 | Bae et al. |
| 2009/0303690 A1 | 12/2009 | Lee et al. |
| 2010/0237481 A1* | 9/2010 | Chi et al. ............ 257/685 |
| 2010/0244217 A1* | 9/2010 | Ha et al. ............ 257/686 |

* cited by examiner

INTEGRATED CIRCUIT PACKAGING SYSTEM HAVING DUAL SIDED CONNECTION AND METHOD OF MANUFACTURE THEREOF

CROSS-REFERENCE TO RELATED APPLICATION(S)

This is a continuation of U.S. patent application Ser. No. 12/413,302 filed Mar. 27, 2009, now U.S. Pat. No. 7,923,290.

TECHNICAL FIELD

The present invention relates generally to an integrated circuit packaging system, and more particularly to an integrated packaging system with a dual sided connection.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is a response to continually increasing demands on information and communication products for ever-reduced sizes, thicknesses, and costs along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made small and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP).

Thus, a need still remains for an integrated circuit packaging system providing high connectivity, low cost manufacturing, and reduced size. In view of the ever-increasing need to save costs and improve efficiencies, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: mounting an integrated circuit, having a device through via and a device interconnect, over a substrate with the device through via traversing the integrated circuit and the device interconnect attached to the device through via; attaching a conductive support over the substrate with the conductive support adjacent to the integrated circuit; providing a pre-formed interposer, having an interposer through via and a pre-attached interconnect, with the pre-attached interconnect attached to the interposer through via; mounting the pre-formed interposer over the integrated circuit and the conductive support with the pre-attached interconnect over the device through via; and forming an encapsulation over the substrate covering the integrated circuit, the conductive support, and partially covering the pre-formed interposer.

The present invention provides an integrated circuit packaging system, including: a substrate; an integrated circuit, having a device through via and a device interconnect, over the substrate with the device through via traversing the integrated circuit and the device interconnect attached to the device through via; a conductive support over the substrate with the conductive support adjacent to the integrated circuit; a pre-formed interposer, having an interposer through via and a pre-attached interconnect, with the pre-attached interconnect attached to the interposer through via including the pre-formed interposer having the characteristics of the pre-attached interconnect pre-attached to a carrier of the pre-formed interposer, and the pre-formed interposer over the integrated circuit and the conductive support with the pre-attached interconnect over the device through via; and an encapsulation over the substrate covering the integrated circuit, the conductive support, and partially covering the pre-formed interposer.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
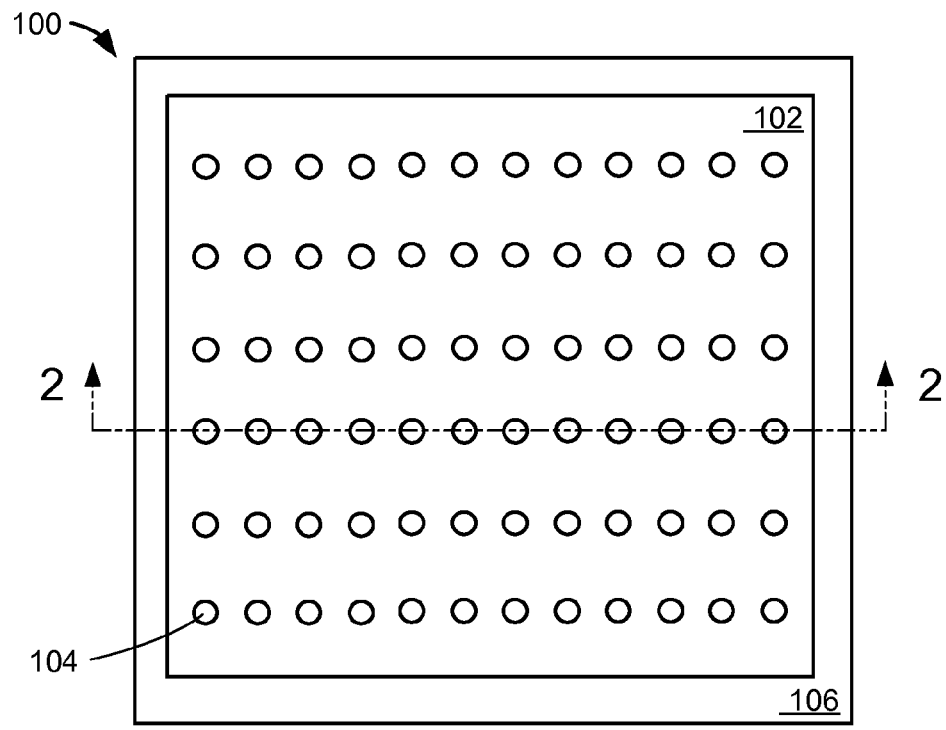
FIG. 1 is a top view of the integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view of the integrated circuit packaging system 100 depicts a pre-formed interposer 102, such as a pre-formed through via interposer or a preformed organic interposer. The pre-formed interposer 102 can include a mounting contact 104. An encapsulation 106, such as a cover including an epoxy molding compound, can surround the pre-formed interposer.

For illustrative purposes, the integrated circuit packaging system 100 is shown with the mounting contact 104 in an array configuration, although it is understood that the integrated circuit packaging system 100 can have a different configuration with the mounting contact 104. For example, the mounting contact 104 can form a peripheral configuration or an array configuration with some of the array location depopulated.

Figure 2:
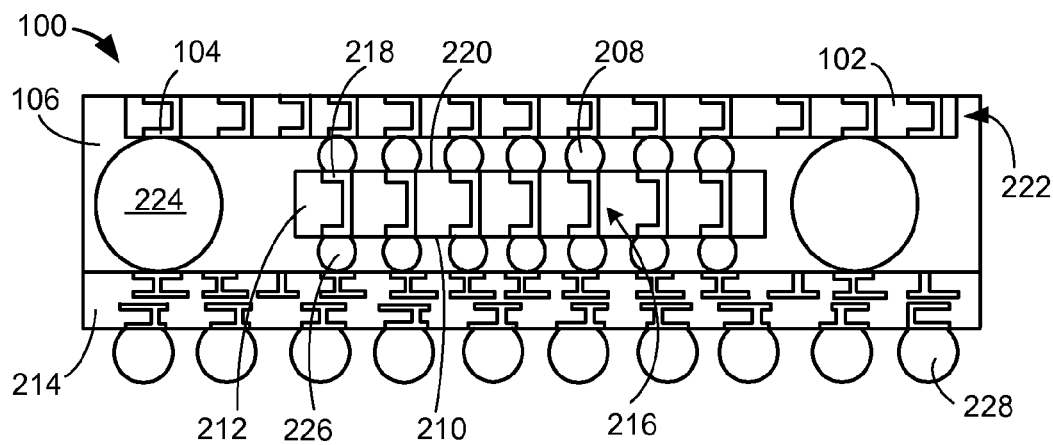
FIG. 2 is a cross-sectional view of the integrated packaging system along line 2-2 of FIG. 1.

Referring now to FIG. 2, therein is shown a cross-sectional view of the integrated circuit packaging system 100 along line 2-2 of FIG. 1. The cross-sectional view of the integrated circuit packaging system 100 depicts the pre-formed interposer 102 within the encapsulation 106. The pre-formed interposer 102 is pre-formed with pre-attached interconnects 208 attached thereto.

The cross-sectional view also depicts an active side 210 of an integrated circuit 212, such as an integrated circuit die or a flip chip, facing a substrate 214, such as a laminated substrate or a printed circuit board.

A device through via 216, such as through silicon via, can include a mounting pad 218 at a non-active side 220 of the integrated circuit 212. The device through via 216 traverses the integrated circuit 212 from the active side 210 to the non-active side 220.

The pre-formed interposer 102 includes a carrier 222, such as a through via interposer or an organic interposer, and the pre-attached interconnects 208, such as solder on pad (SOP) bump or other pre-attached conductive protrusion, attached thereto. The mounting pad 218 can be attached to the pre-attached interconnects 208.

The device through via 216 can be coupled to the substrate 214. A conductive support 224, such as a solder ball, a conductive post, or a conductive column, can be mounted over the substrate 214 and adjacent to the integrated circuit 212.

The integrated circuit 212 can include a device interconnect 226, such as a solder ball, conductive bump, or a conductive post, between the device through via 216 and the substrate 214. The device interconnect 226 can also attach between the active side 210 and the substrate 214 without attaching to the device through via 216.

The encapsulation 106 can be coplanar with the exposed portion of the pre-formed interposer 102. The encapsulation surrounds the pre-attached interconnects 208. The integrated circuit packaging system 100 has the characteristic of robust connection between the pre-attached interconnects 208 and the carrier 222 of the pre-formed interposer 102 such that the mechanical and electrical connection breaks or gaps have been eliminated or reduced. The pre-forming the pre-attached interconnects 208 with the carrier 222 ensure robust bond thereby reducing breakage during the formation of the encapsulation 106.

An external interconnect 228, such as solder balls or conductive bumps, can attach under the substrate 214. The conductive support 224 can be attached to the pre-formed interposer 102. The conductive support 224 can be coupled to the mounting contact 104. The pre-attached interconnects 208 can be attached to the mounting pad 218 coupled to the device through via 216 at the non-active side 220. The pre-attached interconnects 208 can be coupled to the mounting contact 104.

Figure 3:
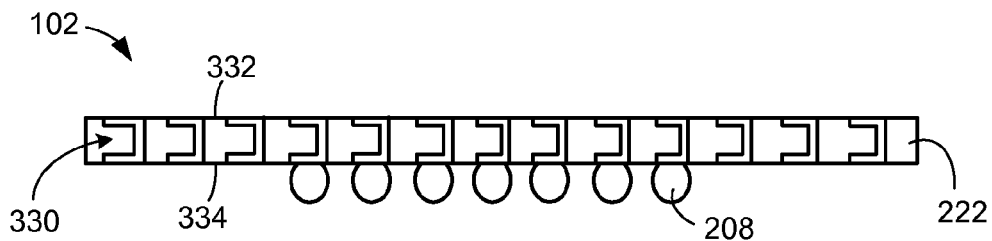
FIG. 3 is a cross-sectional view of the pre-formed interposer having the pre-attached interconnects.

Referring now to FIG. 3, therein is shown a cross-sectional view of the pre-formed interposer 102 having the pre-attached interconnects 208. The pre-formed interposer 102 includes an interposer through via 330, such as an electrical connection structure including a conductive material, copper solder or tungsten. The interposer through via 330 can be a through silicon via or an electrical via. The pre-attached interconnects 208 can be attached to the interposer through via 330.

The interposer through via 330 traverses the pre-formed interposer 102 from a pre-formed interposer non-active side 332 to a pre-formed interposer active side 334. The interposer active side 334 includes active circuitry thereon. The interposer non-active side 332 does not include active circuitry thereon. The interposer through via 330 allows connection from the outside to the interior of the integrated circuit packaging system 100 of FIG. 2 as well as to the external interconnect 228 of FIG. 2.

For illustrative purposes, the pre-formed interposer 102 is shown with the pre-attached interconnects 208 attached to the interposer through via 330, although it is understood that the pre-formed interposer 102 can have a different configuration with the pre-attached interconnects 208. For example, the pre-formed interposer 102 can have the pre-attached interconnects 208 attached to the carrier 222 but not necessarily to the interposer through via 330.

The pre-formed interposer 102 can be formed and tested to ensure reliable mechanical and electrical connection between the carrier 222 and the pre-attached interconnects 208. The pre-attachment ensure the robust connection between the carrier 222 and the pre-attached interconnects 208 is maintained with the mounting over the conductive support 224 of FIG. 2. If interconnects are applied to the non-active side 222 of FIG.

2 instead of pre-attached to the carrier 222, height variations of the conductive support 224 can cause poor or no connection to the carrier 222.

Figure 4:
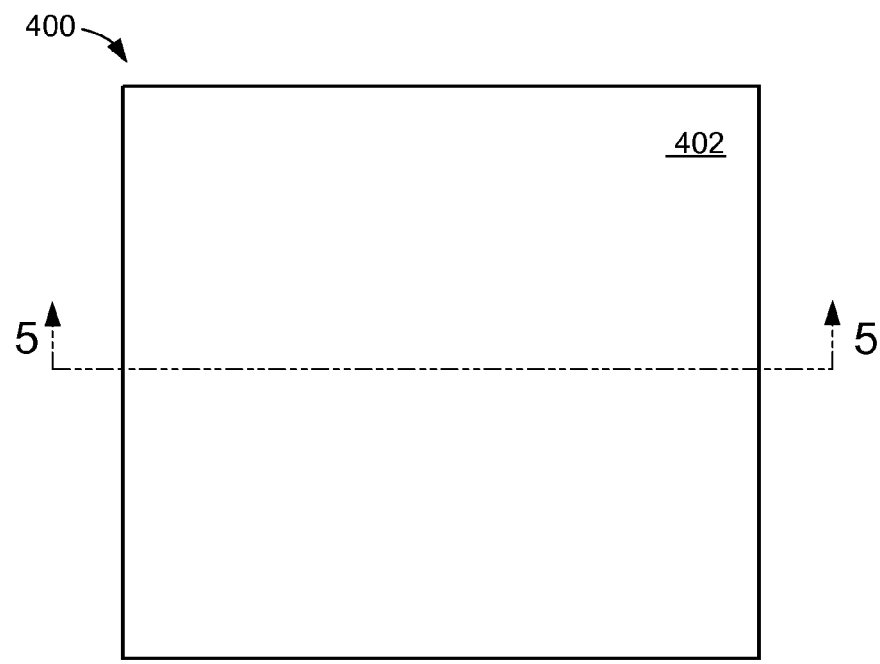
FIG. 4 is a top view of an integrated circuit package-on-package system with the integrated circuit packaging system of FIG. 1 in a second embodiment of the present invention.

Referring now to FIG. 4, therein is shown a top view of an integrated circuit package-on-package system 400 with the integrated circuit packaging system 100 of FIG. 1 in a second embodiment of the present invention. The top view depicts a mounting device 402, such as an integrated circuit die, a flip chip, or a packaged integrated circuit.

Figure 5:
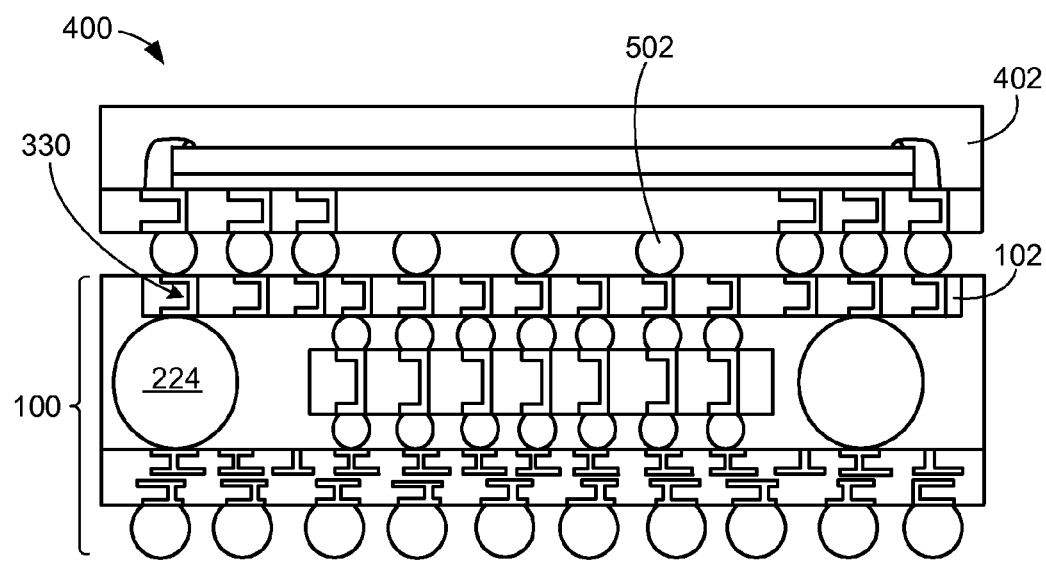
FIG. 5 is a cross-sectional view of the integrated circuit package-on-package system along line 5-5 of FIG. 4.

Referring now to FIG. 5, therein is shown a cross-sectional view of the integrated circuit package-on-package system 400 along line 5-5 of FIG. 4. The cross-sectional view depicts the mounting device 402 mounted over the integrated circuit packaging system 100. A mounting interconnect 502 of the mounting device 402 can attach to the pre-formed interposer 102. The mounting interconnect 502 can attach to the interposer through via 330.

It has been discovered that the present invention provides the integrated circuit packaging system having a pre-formed interposer provides reliable connection structure. The integrated circuit packaging system has the characteristics of being formed with the pre-formed interposer. The pre-attached interconnects to the carrier to form the pre-formed interposer reduces or eliminates poor or weak connections between the pre-attached interconnects and the carrier thereby improving reliability during the encapsulating process. Furthermore, the use of a pre-formed interposer provides increased interconnection performance when used with flip chips or other high I/O devices.

It has also been discovered that the present invention provides the integrated circuit packaging system having a dual connectivity and compact footprint. The pre-formed interposer with the interposer though via along with the pre-attached interconnects provide dual connectivity from above and below the integrated packaging system. The device through via and the interposer through via allow the integrated circuit to be electronically coupled to the pre-formed interposer eliminating the need for additional connection structures such as solder balls that can require additional footprint space. Furthermore, the use of a pre-formed interposer can increase the ease of mounting an additional package on top of the integrated circuit package.

Thus, it has been discovered that the integrated circuit packaging of the present invention furnishes important and heretofore unknown and unavailable solutions, capabilities, and functional aspects for dual connectivity with the integrated circuit packaging system.

Figure 6:
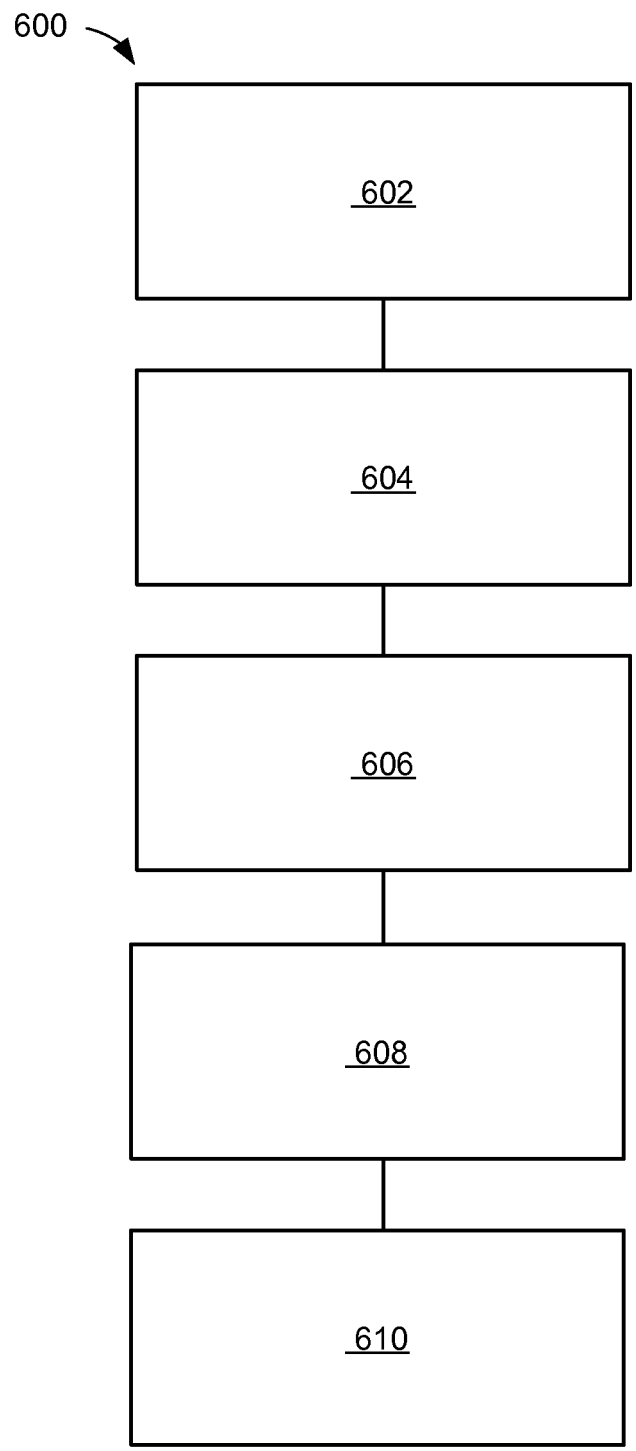
FIG. 6 is a flow chart of a method of manufacture of an integrated circuit packaging system in a further embodiment of the present invention.

Referring now to FIG. 6, therein is shown a flow chart of a method 600 of manufacture of an integrated circuit packaging system 100 in a further embodiment of the present invention. The method 600 includes: mounting an integrated circuit, having a device through via and a device interconnect, over a substrate with the device through via traversing the integrated circuit and the device interconnect attached the device through via in a block 602; attaching a conductive support over the substrate with the conductive support adjacent to the integrated circuit in a block 604; providing a pre-formed interposer, having an interposer through via and a pre-attached interconnect, with the pre-attached interconnect attached to the interposer through via in a block 606; mounting the pre-formed interposer over the integrated circuit and the conductive support with the pre-attached interconnect over the device through via in a block 608; and forming an encapsulation over the substrate covering the integrated circuit, the conductive support, and partially covering the pre-formed interposer in a block 610.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated packaging systems.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
mounting an integrated circuit, having a device through via and a device interconnect, over a substrate with the device through via traversing the integrated circuit and the device interconnect attached to the device through via;
attaching a conductive post over the substrate with the conductive post adjacent to the integrated circuit;
providing a pre-formed interposer, having an interposer through via and a pre-attached interconnect, with the pre-attached interconnect attached to the interposer through via;
mounting the pre-formed interposer over the integrated circuit and the conductive post with the pre-attached interconnect over the device through via; and
forming an encapsulation over the substrate covering the integrated circuit, the conductive post, and covering vertical edges of the pre-formed interposer.

2. The method as claimed in claim 1 wherein mounting the pre-formed interposer over the integrated circuit and the conductive post with the pre-attached interconnect over the device through via includes electrically coupling the pre-attached interconnect and the device through via.

3. The method as claimed in claim 1 wherein forming the encapsulation over the substrate covering the integrated circuit, the conductive post, and partially covering the pre-formed interposer includes exposing the interposer through via.

4. The method as claimed in claim 1 wherein forming the encapsulation over the substrate covering the integrated circuit, the conductive post, and partially covering the pre-formed interposer includes forming the encapsulation coplanar with the exposed portion of the pre-formed interposer.

5. The method as claimed in claim 1 wherein providing the pre-formed interposer, having the interposer through via and the pre-attached interconnect, with the pre-attached interconnect attached to the interposer through via includes providing the pre-formed interposer having a pre-attached solder on pad bump.

6. A method of manufacture of an integrated circuit packaging system comprising:
mounting an integrated circuit, having a device through via and a device interconnect, over a substrate with the device through via traversing the integrated circuit and the device interconnect attached to the device through via and the substrate;

attaching a conductive post over the substrate with the conductive post adjacent to the integrated circuit;

providing a pre-formed interposer, having an interposer through via and a pre-attached interconnect, with the pre-attached interconnect attached to the interposer through via;

mounting the pre-formed interposer over the integrated circuit and the conductive post with the pre-attached interconnect over the device through via; and forming an encapsulation over the substrate covering the integrated circuit, the conductive post, and covering vertical edges of the pre-formed interposer with the encapsulation coplanar with the exposed top portion of the pre-formed interposer.

7. The method as claimed in claim 6 wherein mounting the pre-formed interposer over the integrated circuit and the conductive post with the pre-attached interconnect over the device through via includes electrically coupling the pre-attached interconnect and the conductive post.

8. The method as claimed in claim 6 wherein providing the pre-formed interposer includes providing an organic interposer.

9. The method as claimed in claim 6 further comprising connecting a mounting device and the device through via.

10. The method as claimed in claim 6 wherein mounting the integrated circuit includes mounting a flip chip.

11. An integrated circuit packaging system comprising:
a substrate;
an integrated circuit, having a device through via and a device interconnect, over the substrate with the device through via traversing the integrated circuit and the device interconnect attached to the device through via;
a conductive post over the substrate with the conductive post adjacent to the integrated circuit;
a pre-formed interposer, having an interposer through via and a pre-attached interconnect, with the pre-attached interconnect attached to the interposer through via including:
the pre-formed interposer having the characteristics of the pre-attached interconnect pre-attached to a carrier of the pre-formed interposer, and
the pre-formed interposer over the integrated circuit and the conductive post with the pre-attached interconnect over the device through via; and
an encapsulation over the substrate covering the integrated circuit, the conductive post, and covering vertical edges of the pre-formed interposer.

12. The system as claimed in claim 11 wherein the pre-attached interconnect is electrically coupled to the device through via.

13. The system as claimed in claim 11 wherein the encapsulation exposes the interposer through via.

14. The system as claimed in claim 11 wherein the encapsulation is coplanar with the exposed portion of the pre-formed interposer.

15. The system as claimed in claim 11 wherein the pre-attached interconnect includes a pre-attached solder on pad bump.

16. The system as claimed in claim 11 wherein:
the device interconnect is attached to the substrate; and
the encapsulation is coplanar with the exposed top portion of the pre-formed interposer.

17. The system as claimed in claim 16 wherein the pre-formed interposer is electrically coupled to the conductive post.

18. The system as claimed in claim 16 wherein the pre-formed interposer includes an organic interposer.

19. The system as claimed in claim 16 further comprising a mounting device connected to the device through via.

20. The system as claimed in claim 16 wherein the integrated circuit includes a flip chip.

* * * * *